United States Patent [19]
Okimura

[11] Patent Number: 5,381,378
[45] Date of Patent: Jan. 10, 1995

[54] SEMICONDUCTOR MEMORY DEVICE

[75] Inventor: Yasunori Okimura, Kanagawa, Japan

[73] Assignee: NEC Corporation, Tokyo, Japan

[21] Appl. No.: 128,235

[22] Filed: Sep. 29, 1993

[30] Foreign Application Priority Data

Sep. 29, 1992 [JP] Japan .................. 4-283664

[51] Int. Cl.⁶ .............................................. G11C 8/04
[52] U.S. Cl. ............................. 365/233; 365/189.12; 365/240
[58] Field of Search ................ 365/233, 189.12, 240, 365/239

[56] References Cited

U.S. PATENT DOCUMENTS

| | | | |
|---|---|---|---|
| 4,907,203 | 3/1990 | Wada et al. | 365/238.5 |
| 4,943,947 | 7/1990 | Kobayashi | 365/240 X |
| 4,987,559 | 1/1991 | Miyauchi et al. | 365/240 X |
| 5,222,047 | 6/1993 | Matsuda et al. | 365/233 X |
| 5,260,905 | 11/1993 | Mori | 365/240 X |
| 5,265,063 | 11/1993 | Kogure | 365/233 |
| 5,285,409 | 2/1994 | Hwangbo et al. | 365/240 X |

FOREIGN PATENT DOCUMENTS 0198429 10/1986 European Pat. Off. .
0405459 1/1991 European Pat. Off. .

OTHER PUBLICATIONS

IBM Technical Disclosure Bulletin; Memory Architecture with Flexibility In Bit-Wide Outputs, vol. 31, No. 12, May 1989, pp. 174-175.

*Primary Examiner*—Do Hyun Yoo
*Attorney, Agent, or Firm*—Sughrue, Mion, Zinn, Macpeak & Seas

[57] ABSTRACT

A semiconductor memory circuit includes a memory cell array for storing data, and a bit structure selection circuit for performing a data transfer between the memory cell array and an external device by constructing the data in units of one bit or in units of two bits. The bit structure selection circuit includes a selector for selectively modifying a phase of a first clock signal and a second clock signal in response to a mode signal, and shift register for modifying a shift width of a memory selection signal in response to the first clock signal and the second clock signal supplied through the selector.

2 Claims, 9 Drawing Sheets

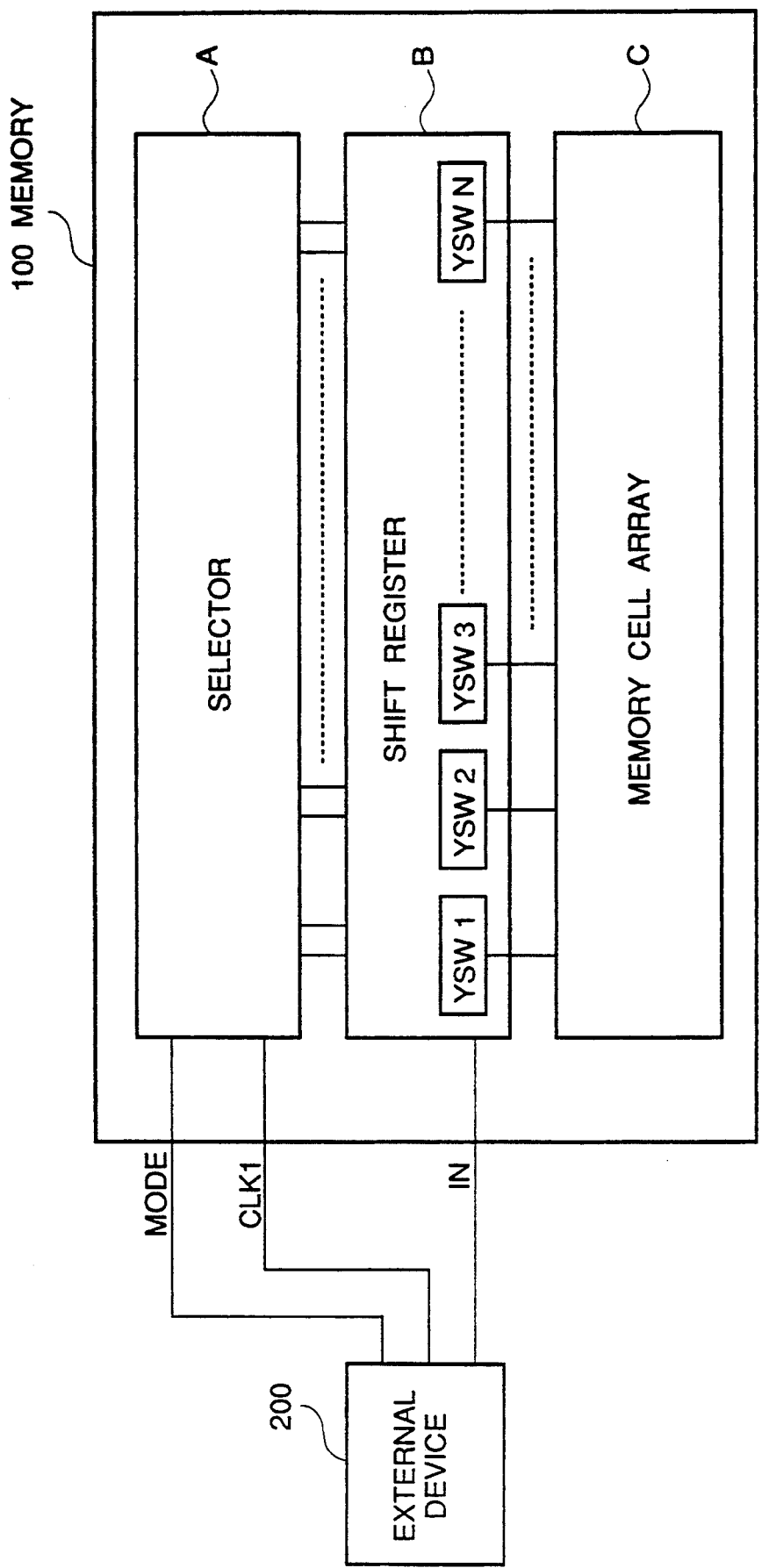

SEMICONDUCTOR MEMORY DEVICE

BACKGROUND OF THE INVENTION

1. Field of the Invention

The present invention relates to a semiconductor memory device, and more particularly to a semiconductor memory device having a multi-bit serial-in or serial-out function and a bit structure switching function.

2. Description of Related Art

In conventional semiconductor memory devices having a multi-bit serial-in and serial-out function, a bit structure has been fixed for each one of products. However, with increase of the bit number in this type of memory, it has become necessary to provide a function for switching the bit structure through an external input.

FIGS. 1A, 1B and 1C show, in combination, a semiconductor memory device in which the above mentioned bit structure switching function is realized by using shift registers included in this type of conventional semiconductor memory device.

In FIGS. 1A, 1B and 1C, Reference Signs "RB" and "RC" designate a shift register, and Reference Sign "SA" shows a selector. In order to determine an address of a memory cell to be read or written, the selector "SA" selects the output of which of the two shift registers "RB" and "RC" should be used.

In FIGS. 1A, 1B and 1C, Reference Numerals 6, 9, 10, 13, 14, 17, 18, 21, 22, 25, 26, 29, 30, 33, 34, 37, 38, 41, 42, 45, 46, 49, 50, 53, 79, 82, 83, 86, 87, 90, 91, 94, 95, 98, 99, 102 and 109 to 120 designate a transfer gate. Reference Numerals 1, 2, 7, 8, 11, 12, 15, 16, 19, 20, 23, 24, 27, 28, 31, 32, 35, 36, 39, 40, 43, 44, 47, 48, 51, 52, 57, 61, 65, 69, 73, 77, 78, 80, 81, 84, 85, 88, 89, 92, 93, 96, 97, 100, 101, 104, 106 and 108 indicate an inverter. Reference Numerals 56, 60, 64, 68, 72, 76, 103, 105 and 107 show a NAND gate.

Now, operation of the conventional example will be explained with reference to a timing chart of FIG. 2. For simplification of the explanation, it is assumed that outputs OUT1 to OUT6, OUT12, OUT34 and OUT56 of the shift registers "RB" and "RC" have been initialized to a ground level (called a "low level" hereinafter).

It is continued that the low level and a voltage supply voltage (called a "high level" hereinafter) are periodically alternately supplied as a shift register control signal CLK1. If a shift register input signal IN is brought to a high level only during the period of a certain cycle of the clock CLK1, the first shift register outputs OUT1 and OUT12 are brought to a high level in the same cycle. When CLK1 goes into a next cycle, the first shift register outputs OUT1 and OUT12 are brought to a low level, and the second shift register outputs OUT2 and OUT34 are brought to a high level. Similarly, in the following, at each time the clock CLK1 advances its cycle, information of a shift register input signal IN is sequentially transferred through the shifter registers, from OUT1 to OUT2, and then, from OUT2 to OUT3, and so on.

At this time, if a bit structure control signal MODE is at a low level, a memory selection signal YSW1 of memory selection signals YSW1 to YSW6 is firstly brought to a high level, so that a group of memory cells selected by the memory selection signal YSW1 are activated. In the next cycle, the memory selection signal YSW2 is brought to a high level, so that a group of memory cells selected by the memory selection signal YSW2 are activated. On the other hand, when the bit structure control signal MODE is at a high level, the memory selection signals YSW1 and YSW2 are firstly brought to a high level, so that groups of memory cells selected by the memory selection signals YSW1 and YSW2 are activated. In the next cycle, groups of memory cells selected by the memory selection signals YSW3 and YSW4 are activated. Accordingly, when the bit structure control signal MODE is at a high level, it is possible to activate the memory cell groups that are two times the memory cell groups) activated when the bit structure control signal MODE is at a low level. Therefore, it is possible to change the bit structure from a 4-bit structure to a 8-bit structure, or alternatively, from the 8-bit structure to a 16-bit structure.

The above mentioned conventional bit structure switching circuit requires a plurality of shift registers of the number corresponding to the number of the bit structures to be switched over, and also needs a selector for controlling on the basis of the output of which of the plurality of shift registers the memory cell selection should be performed. Accordingly, the above mentioned conventional bit structure switching circuit requires an increased number of circuit constituents, and therefore, needs a greatly increased chip area when the circuit is implemented in an integrated circuit.

SUMMARY OF THE INVENTION

Accordingly, it is an object of the present invention to provide a bit structure switching circuit which has overcome the above mentioned defect of the conventional one.

Another object of the present invention is to provide a bit structure switching circuit which is used in a semiconductor memory circuit and which can increase the number of bit structures to be switched over, without increasing the number of shift registers.

The above and other objects of the present invention are achieved in accordance with the present invention by a semiconductor memory circuit including a memory cell array for storing data, and a bit structure selection circuit for performing data transfer between the memory cell array and an external device by constructing said data in units of a first bit number or in units of a second bit number different from the first bit number, the bit structure selection circuit including a selector for selectively modifying a phase of a first clock signal and a second clock signal in response to a mode signal, and shift register for modifying a shift width of a memory selection signal in response to the first clock signal and the second clock signal supplied through the selector.

When the mode signal is at a first level, the first clock signal and the second clock signal are supplied in the same phase, but when the mode signal is at a second level, the first clock signal and the second clock signal are supplied in a phase complementary to each other. Therefore, a shift width changes in the shift register so that the selection number of memory cells becomes different.

The above and other objects, features and advantages of the present invention will be apparent from the following description of preferred embodiments of the invention with reference to the accompanying drawings.

BRIEF DESCRIPTION OF THE DRAWINGS

FIG. 3 is a block diagram of one embodiment of the semiconductor memory circuit in accordance with the present invention;

DESCRIPTION OF THE PREFERRED EMBODIMENTS

Figure 1A:
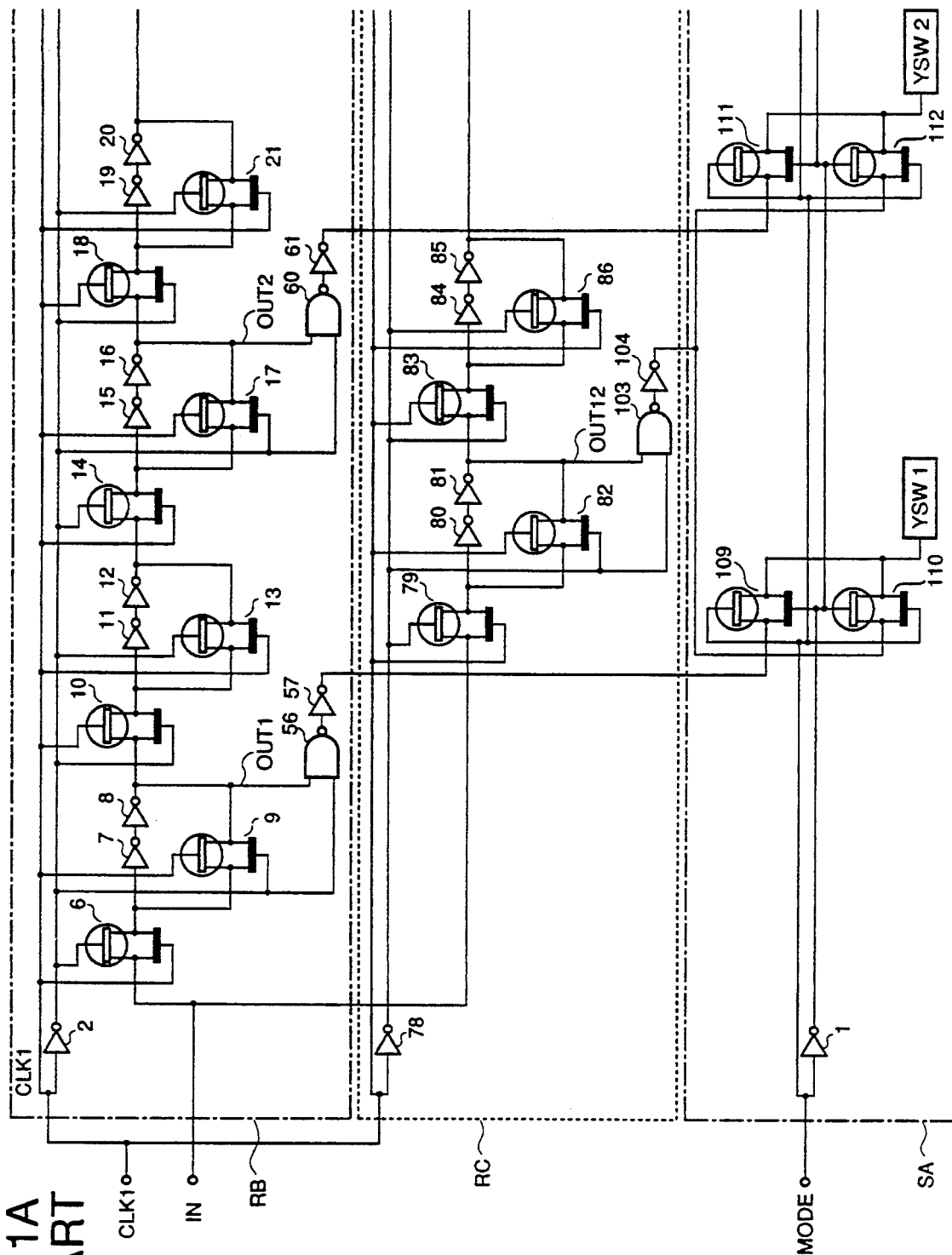
FIGS. 1A, 1B and 1C show, in combination, a semiconductor memory device according to the prior art in which the bit structure switching function is realized by using a plurality of shift registers.
Figure 1B:
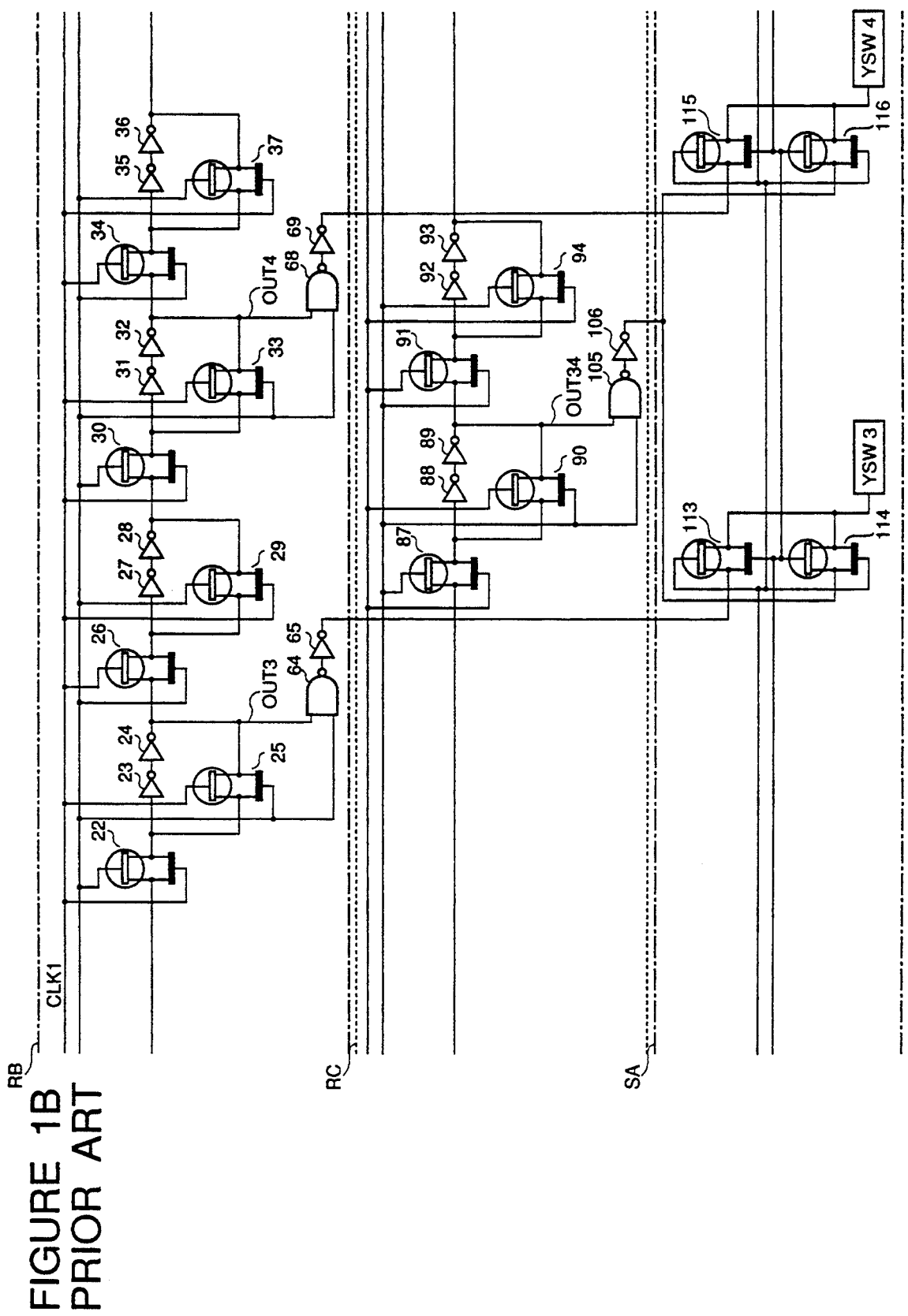
Figure 1C:
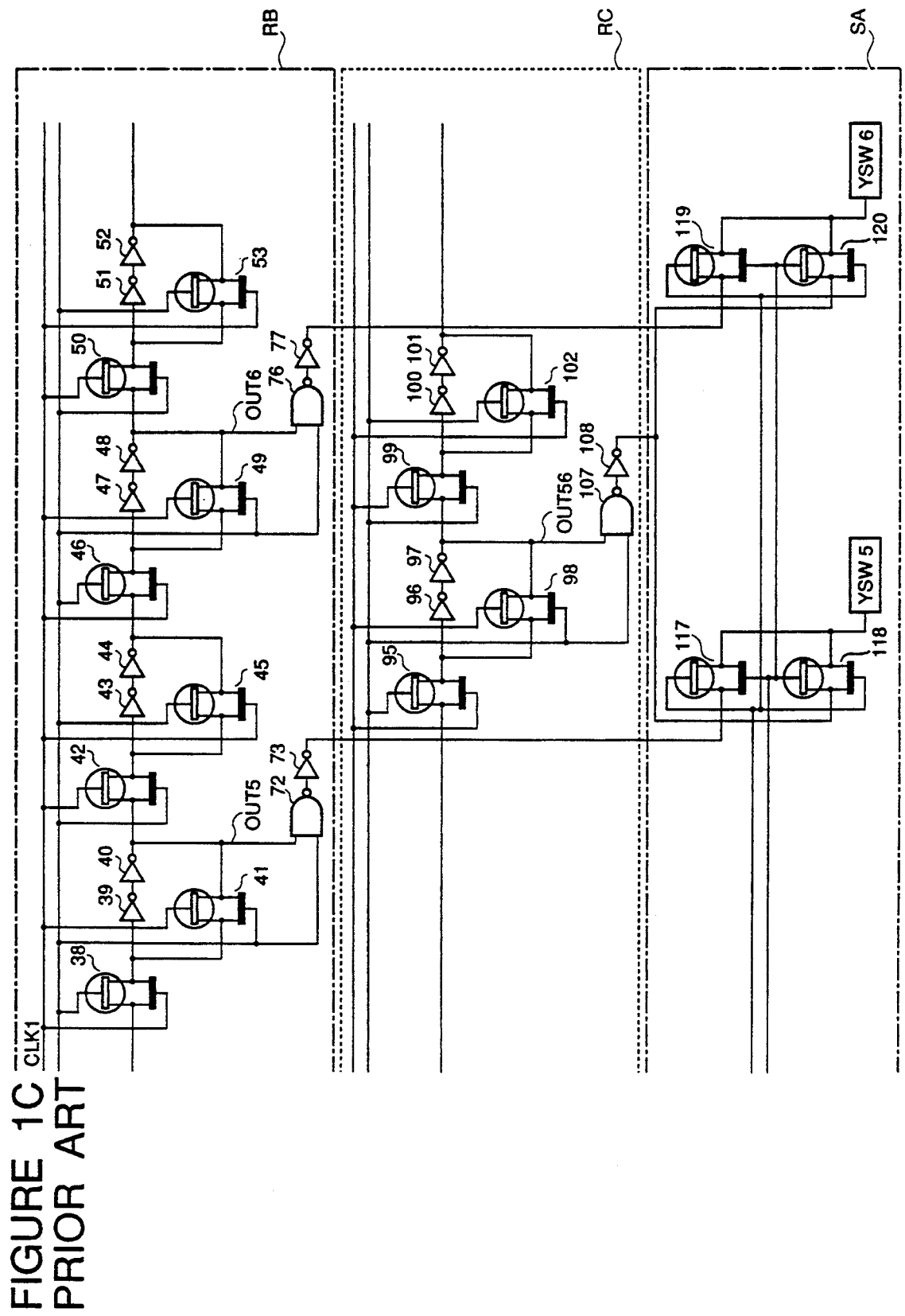
Figure 2:
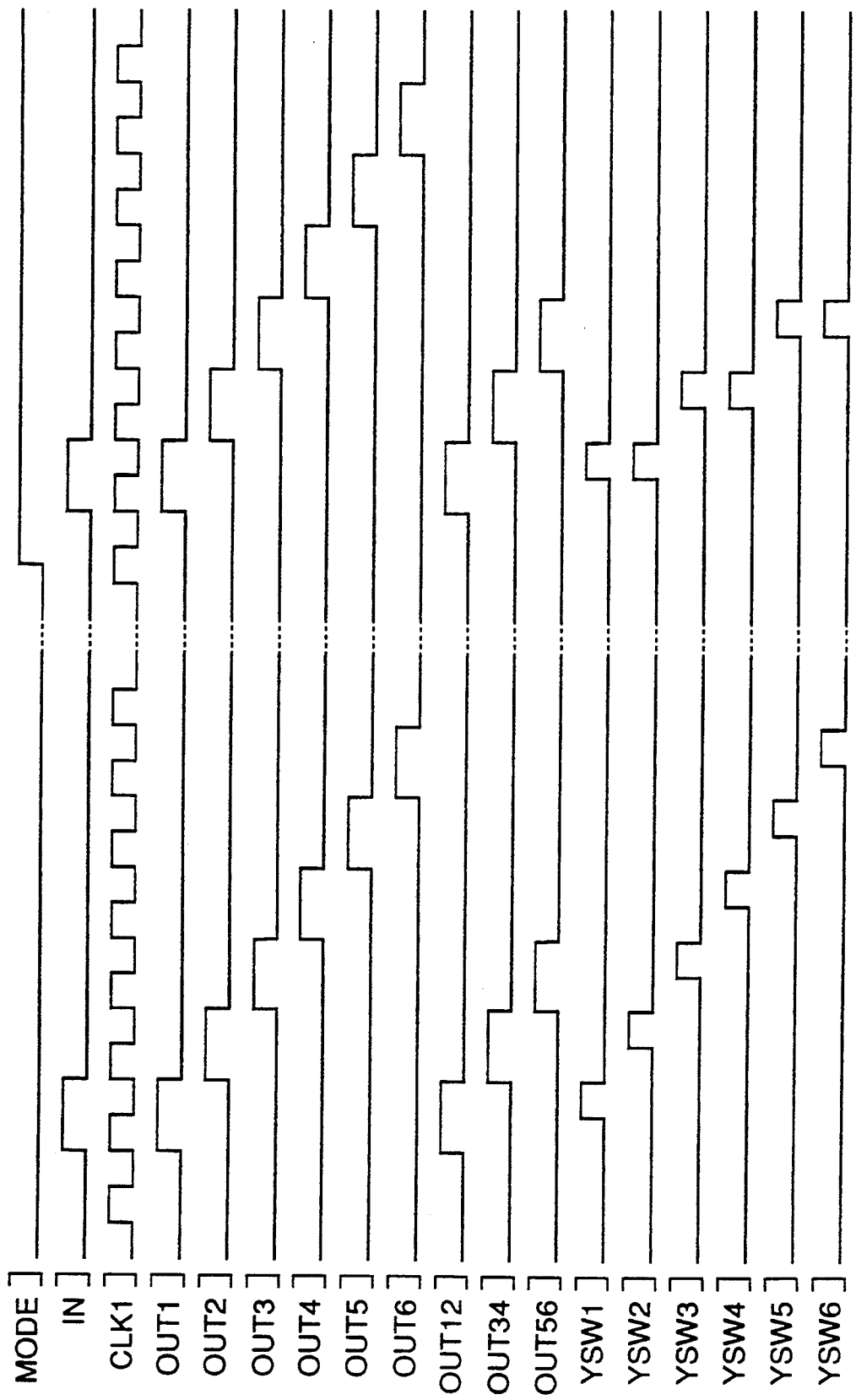
FIG. 2 is a timing chart illustrating an operation of the conventional example shown in FIGS. 1A, 1B and 1C.

Referring to FIG. 3, there is shown a block diagram of one embodiment of the semiconductor memory circuit in accordance with the present invention.

In FIG. 3 the semiconductor memory circuit is generally designated with Reference Numeral 100, and is configured to receive a bit structure control signal MODIE, a shift register control signal CLK1, and a shift register input signal IN from an external device 200. In addition, the semiconductor memory circuit 100 includes a selector "A" receiving the bit structure control signal MODE and the shift register control signal CLK1, a memory cell selection shifter register "B" receiving the shift register input signal IN and controlled by the selector A so as to selectively activate a plurality of memory selection signals YSW1 to YSWN, and a memory cell array "C" composed of a corresponding number of groups of memory cells which are selectively activated by the corresponding memory selection signals YSW1 to YSWN, respectively.

Figure 4A:
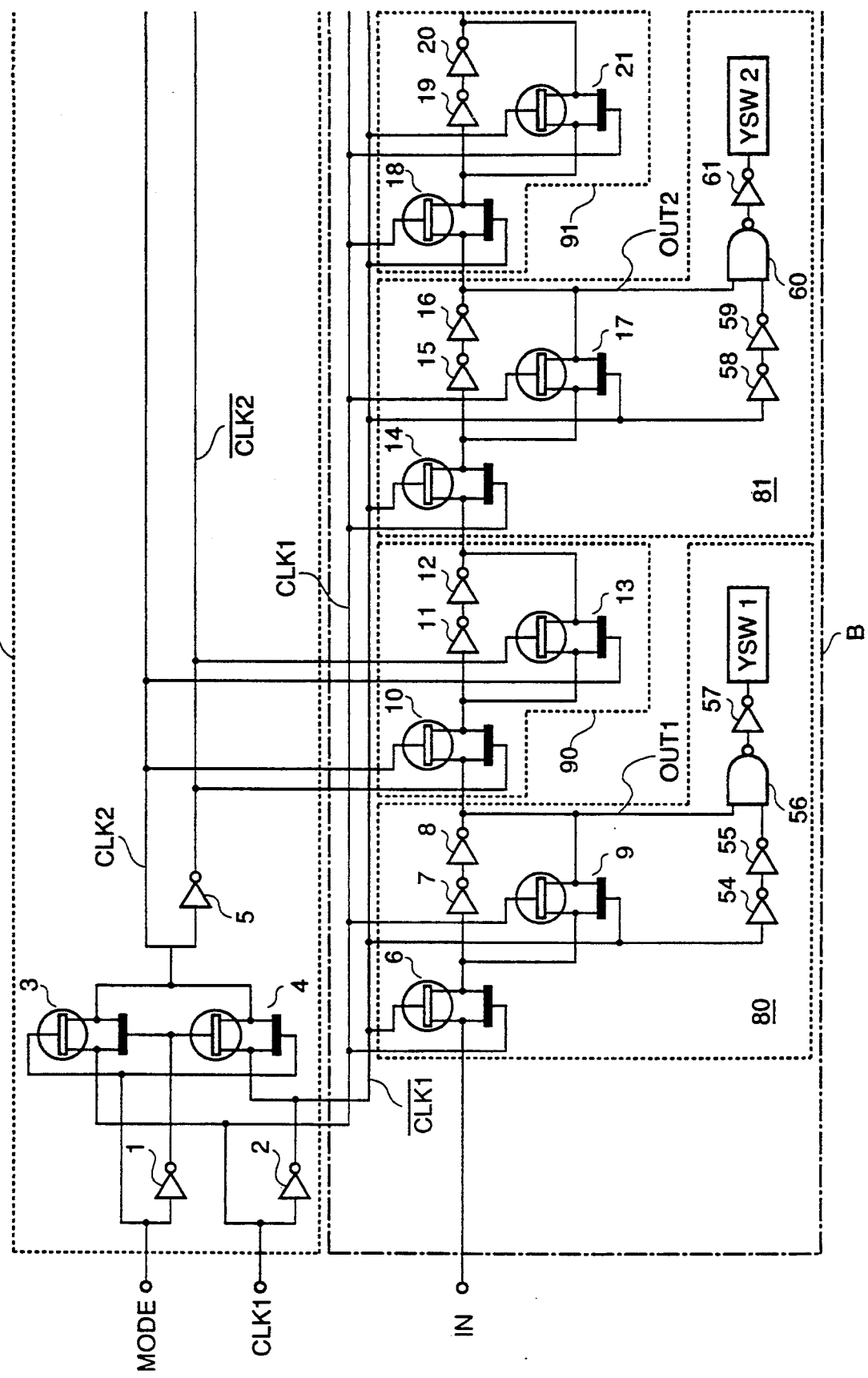
FIGS. 4A, 4B and 4C are partial circuit diagrams showing the bit structure switching circuit used in the semiconductor memory circuit shown in FIG. 3, in such a manner that a continuous circuit portion of the bit structure switching circuit is shown by combining FIGS. 4A, 4B and 4C.
Figure 4B:
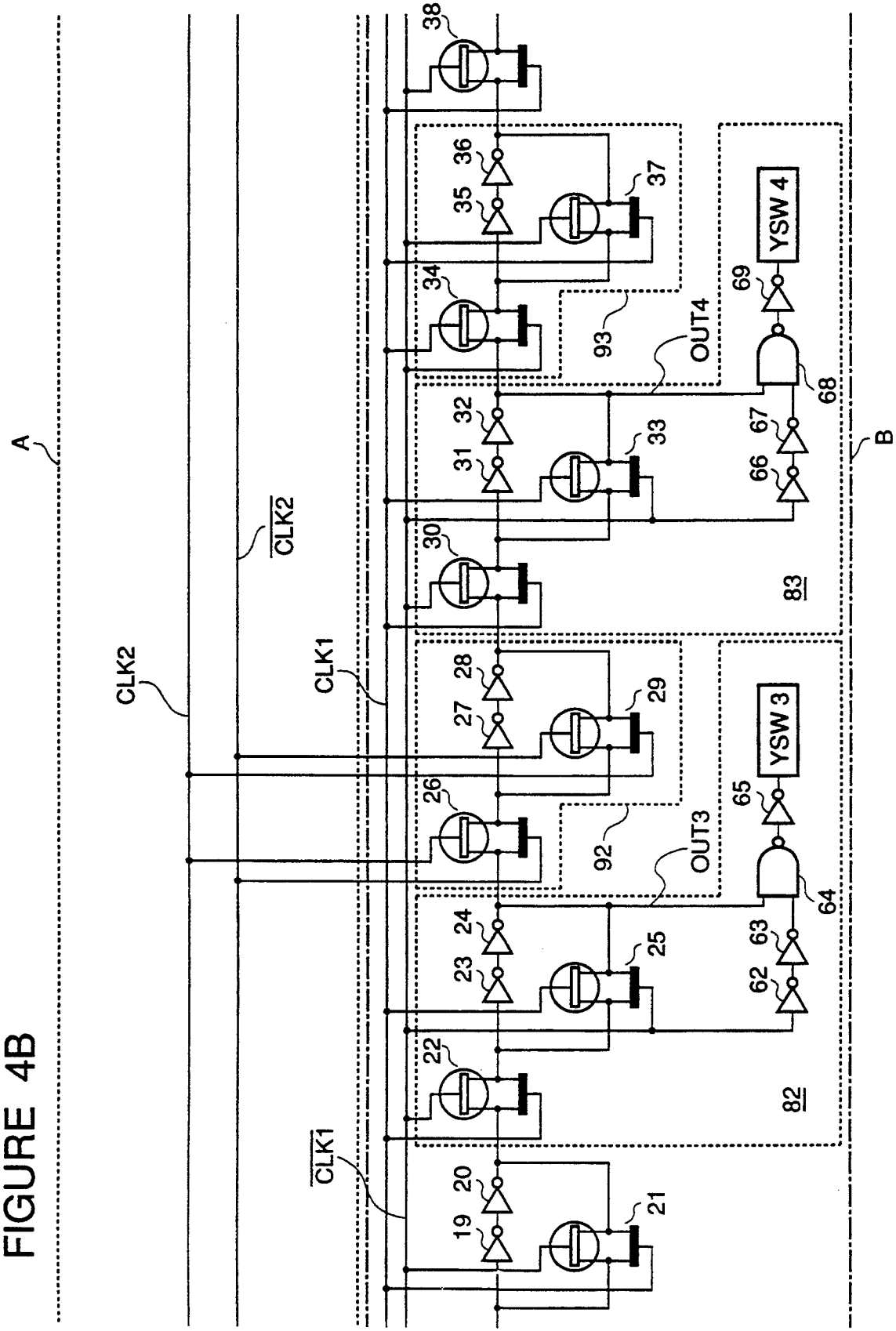
Figure 4C:
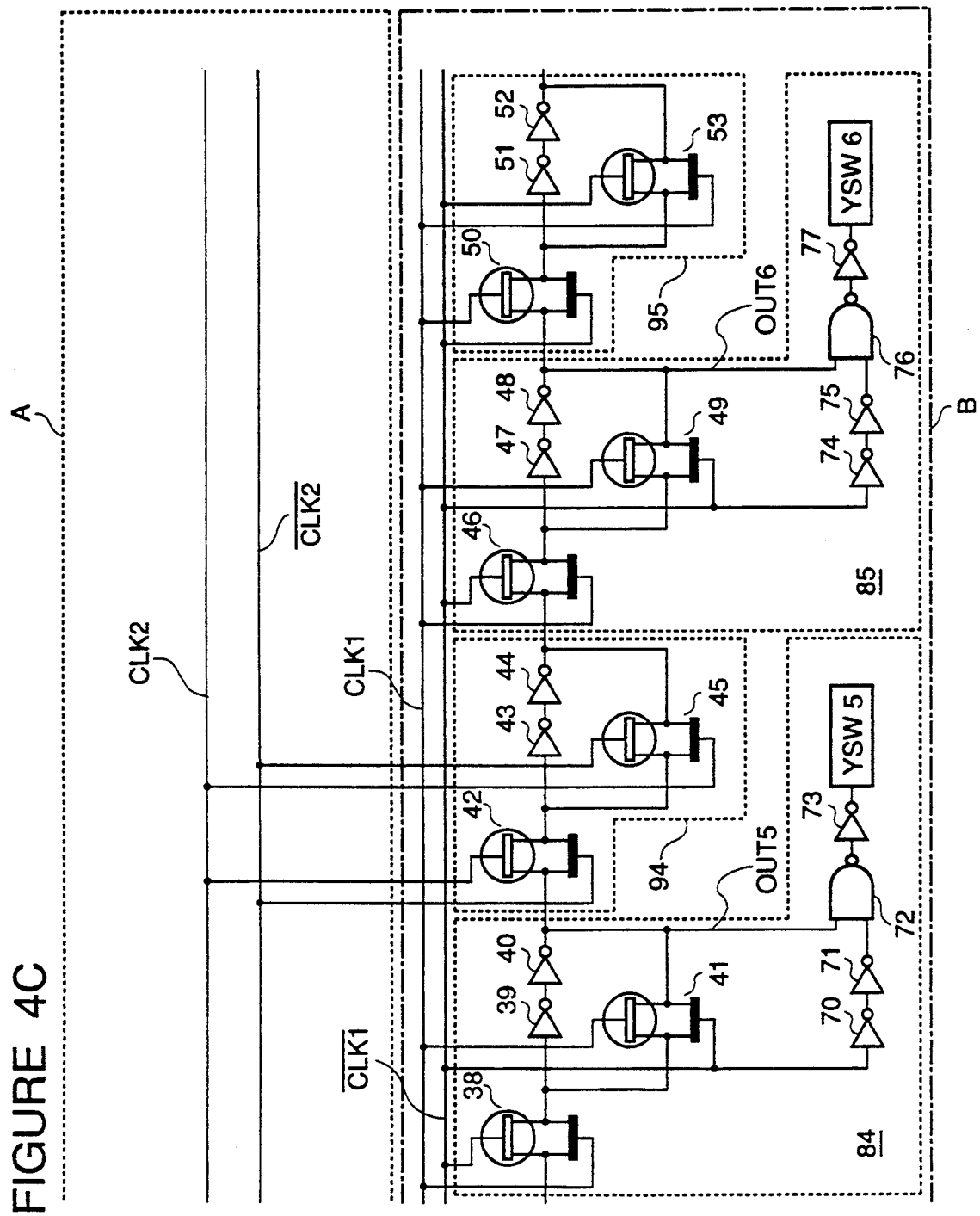

Referring to FIGS. 4A, 4B and 4C, there are shown partial circuit diagrams showing a bit structure switching circuit composed of the selector "A" and the memory cell selection shifter register "B" shown in FIG. 3. A continuous circuit portion of the bit structure switching circuit corresponding to the memory selection signals YSW1 to YSW6 is shown by combining FIGS. 4A, 4B and 4C. Therefore, as a guide for combining FIGS. 4A and 4B to each other, elements 19, 20 and 21 are shown in both of FIGS. 4A and 4B, and as a guide for combining FIGS. 4B and 4C to each other, an element 38 is shown in both of FIGS. 4B and 4C.

In FIGS. 4A, 4B and 4C, Reference Numerals 1, 2, 5, 7, 8, 11, 12, 15, 16, 19, 20, 23, 24, 27, 28, 31, 32, 35, 36, 39, 40, 43, 44, 47, 48, 51, 52, 54, 55, 57, 58, 59, 61, 62, 63, 65, 66, 67, 69, 70, 71, 73, 74, 75 and 77 designate an inverter. Reference Numerals 3, 4, 6, 9, 10, 13, 14, 17, 18, 21, 22, 25, 26, 29, 30, 33, 34, 37, 38, 41, 42, 45, 46, 49, 50 and 53 show a transfer gate. Reference Numerals 56, 60, 64, 68, 72 and 76 indicate a NAND gate. Each of the transfer gates is composed of one N-channel MOS transistor and one P-channel MOS transistor connected in parallel to each other, and a pair of control signals complementary to each other are applied to a gate of the N-channel MOS transistor and the P-channel MOS transistor, respectively.

As will be apparent in FIG. 4A, the selector "A" includes the inverters 1, 2 and 5 and the transfer gates 3 and 4 connected as shown. The bit structure control signal MODE is connected directly to a gate of the P-channel MOS transistor of the transfer gate 3 and to a gate of the N-channel MOS transistor of the transfer gate 4. The bit structure control signal MODE is also connected to an input of the inverter 1, which in turn has an output connected to a gate of the N-chapel MOS transistor of the transfer gate 3 and to a gate of the P-channel MOS transistor of the transfer gate 4. In addition, the shift register control signal CLK1 is connected to an input of the transfer gate 3, and also connected to an input of the inverter 2 having an output, generating an inverted signal $\overline{CLK1}$ of the shift register control signal CLK1. This inverted signal $\overline{CLK1}$ is supplied to an input of the transfer gate 4. An output of the transfer gate 3 had an output of the transfer gate 4 are connected in common to generate a second shift register control signal CLK2, which is also supplied to an input of the inverter 5 having its output generating an inverted signal $\overline{CLK2}$ of the second shift register control signal CLK2.

Thus, the first shift register control signal CLK1 and its inverted signal $\overline{CLK1}$ and the second shift register control signal CLK2 and its inverted signal $\overline{CLK2}$ are supplied to the shift register "B".

In the selector "A" having the above mentioned arrangement, when the bit structure control signal MODE is at a ground level or a low level, the transfer gate 3 is open or conductive, and the transfer gate 4 is closed or blocked. Accordingly, the second shift register control signal CLK2 has the same phase as that of first shift register control signal CLK1. On the other hand, when the bit structure control signal MODE is at a voltage supply voltage level or a high level, the transfer gate 3 is closed or blocked, and the transfer gate 4 is open or conductive. Accordingly, the second shift register control signal CLK2 has the phase opposite or complementary to that of first shift register control signal CLK1.

As mentioned above, the portion of the shift register shown in FIGS. 4A, 4B and 4C corresponds to a circuit portion for generating the memory selection signals YSW1 to YSW6. A first register stage 80 for generating the memory selection signal YSW1 includes the transfer gates 6 and 9, the inverters 7, 8, 54, 55 and 57 and the NAND gate 56 connected as shown in FIG. 4A.

Namely, the shift register input signal IN is supplied through the transfer gate 6 to an input of the inverter 7, whose output is connected to an input of the inverter 8. An output of the inverter 8 constitutes an output OUT1 of the first register stage 80 of the shift register, and is connected to one input of the NAND gate 56 having its output connected to an inverter 57 for generating the memory selection signal YSW1. The output of the inverter 8 is also connected through the transfer gate 9 to the input of the inverter 7. A gate of an N-channel MOS transistor of the transfer gate 6 and a gate of a P-channel MOS transistor of the transfer gate 9 are connected to receive the first shift register control signal CLK1, and a gate of a P-channel MOS transistor of the transfer gate 6 and a gate of an N-channel MOS transistor of the transfer gate 9 are connected to receive the inverted first shift register control signal $\overline{CLK1}$, which is also supplied through the cascaded inverters 54 and 55 to the other input of the NAND gate 56.

The output OUT1 of the first register stage 80 having tile above mentioned structure is supplied through a first transfer gate 90 to a second register gate 81 for generating the memory selection signal YSW2. This second stage 81 includes the transfer gates 14 and 17, the inverters 15, 16, 58, 59 and 61 and the NAND gate 60 connected as shown in FIG. 4A, similarly to the the first register stage. Third to sixth stages 82 to 85 for generating the memory selection signals YSW3 to YSW6, respectively are constructed similarly to the the first register stage 80.

The first transfer stage 90 between the first register stage 80 and the second register stage 81 is composed of the transfer gates 10 and 13 and the inverters 11 and 12 connected as shown in FIG. 4A. The output OUT1 of the first register stage 80 is supplied through the transfer gate 10 to an input of the inverter 11, whose output is connected to an input of the inverter 12. An output of the inverter 12 is connected to an input of the second register stage 81 and also connected through the transfer gate 13 to the input of the inverter 11. A gate of a P-channel MOS transistor of the transfer gate 10 and a gate of an N-channel MOS transistor of the transfer gate 13 are connected to receive tile second shift register control signal CLK2, and a gate of an N-channel MOS transistor of the transfer gate 10 and a gate of a P-channel MOS transistor of the transfer gate 13 are connected to receive the inverted second shift register control signal $\overline{CLK2}$.

A second transfer stage 91 between the second register stage 81 and the third register stage 82 is constructed of the transfer gates 18 and 21 and the inverters 19 and 20, similarly to the first transfer stage 90 between the first register stage 80 and tile second register stage 81, but is controlled by the first shift register control signal CLK1 and its inverted signal $\overline{CLK1}$. In addition, a third transfer stage 92 between the third register stage 82 and the fourth register stage 83 and a fifth transfer stage 94 between the fifth register stage 84 and the sixth register stage 85 are constructed similarly to the first transfer stage 90 between the first register stage 80 and the second register stage 81, and is controlled by the second shift register control signal CLK2 and its inverted signal $\overline{CLK2}$. A fourth transfer stage 93 between the fourth register stage 83 and the fifth register stage 84 and a sixth transfer stage 95 between the sixth register stage 85 and a seventh register stage (not shown) are constructed similarly to the second transfer stage 91 between the second register stage 81 and the third register stage 82, but is controlled by the first shift register control signal CLK1 and its inverted signal $\overline{CLK1}$.

Figure 5:
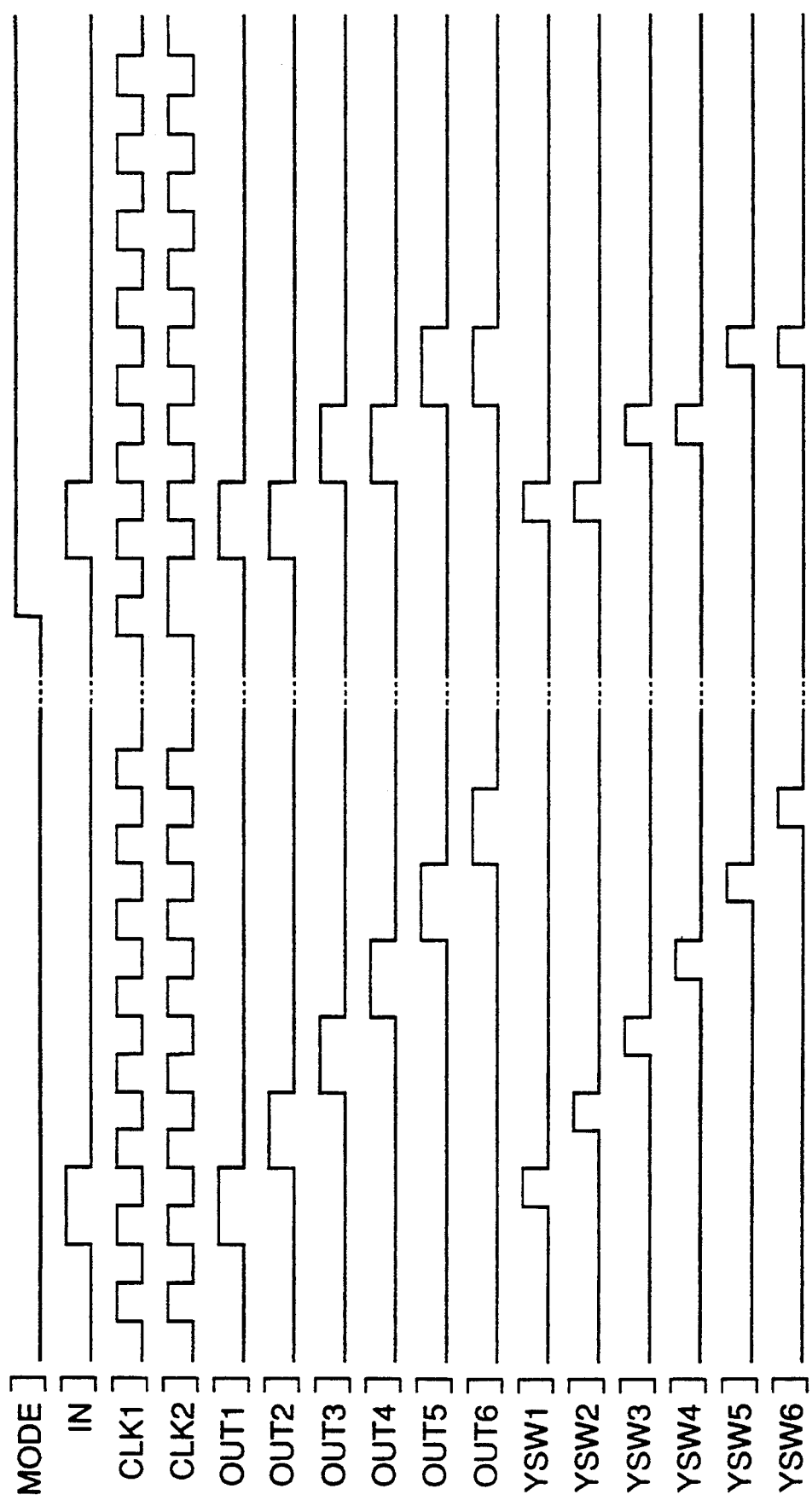
FIG. 5 is a timing chart illustrating an operation of the circuit portion shown in FIGS. 4A, 4B and 4C.

Now, operation of the circuit will be explained with reference to a timing chart of FIG. 5.

For simplification of the explanation, it is assumed that outputs OUT1 to OUT6 of the shift register "B" have been initialized to a low level.

If the bit structure control signal MODE is at a low level, the shift register control signals CLK1 and CLK2 change in the same phase. When it is continued that the low level and the high level are periodically alternately supplied as the first shift register control signal CLK1, if the shift register input signal IN is brought to a high level only during the period of a certain cycle of the clock CLK1, the first shift register output OUT1 is brought to a high level in the same cycle. When CLK1 goes into a next cycle, the first shift register output OUT1 is brought to a low level, and the second shift register output OUT2 is brought to a high level. Similarly, in the following, at each time the clock CLK1 advances its cycle, information of shift register input signal IN is sequentially transferred through the shifter register "B", from OUT1 to OUT2, and then, from OUT2 to OUT3, and so on.

At this time, when he first shift register output OUT1 is brought to the high level, the memory selection signal YSW1 is brought to a high level during a period corresponding to the high level of the inverted first shift register control signal $\overline{CLK1}$, so that a group of memory cells selected by the memory selection signal YSW1 are activated. When the second shift register output OUT2 is brought to a high level, the memory selection signal YSW2 is brought to a high level, so that a group of memory cells selected by the memory selection signal YSW2 are activated.

When the bit structure control signal MODE is at a high level, the shift register control signal CLK2 becomes in a phase complementary to that of the shift register control signal CLK1. Therefore, in a first cycle in which the shift register input IN is brought to a high level, the outputs OUT1 and OUT2 are brought together into a high level. In a next cycle, the outputs OUT1 and OUT2 are brought together into a low level, and the outputs OUT3 and OUT4 are brought together into a high level. Similarly, in the following, the information of the shift register input IN is transferred in units of two outputs. Accordingly, the memory cell selection signals are activated in units of two selection signals in such a manner that, in the first cycle, the memory cell selection signals YSW1 and YSW2 are brought to the high level, and in the second cycle, the memory cell selection signals YSW3 and YSW4 are brought to the high level, and so on. Thus, by changing the bit structure control signal MODE between the low level and the high level, it is possible to change the bit structure, completely similarly to the conventional example.

Accordingly, when the bit structure control signal MODE is at a high level, it is possible to activate the memory cell groups that are two times the memory cell group(s) activated when the bit structure control signal MODE is at a low level. Therefore, it is possible to change the bit structure from a 4-bit structure to a 8-bit structure, or alternatively, from the 8-bit structure to a 16-bit structure.

As mentioned above, since the present invention is so configured as to be capable of changing the data shift width of the shift register, it is no longer necessary to increase the number of shift registers in accordance with the number of bit structures to be switched over. Accordingly, it is possible to effectively suppress the increase of the chip area.

The invention has thus been shown and described with reference to the specific embodiments. However, it should be noted that the present invention is in no way limited to the details of the illustrated structures but changes and modifications may be made within the scope of the appended claims.

I claim:

1. A semiconductor memory circuit comprising:
   a memory cell array for storing data;
   a bit structure selection circuit for performing a data transfer between said memory cell array and an external device either in a first transfer mode in which said data is transferred in units of a first bit number or in a second transfer mode in which said data is transferred in units of a second bit number different from the first bit number, said bit structure selection circuit including:

a selector which receives an input clock signal and a mode signal, and which is configured to generate a first clock signal and a second clock signal derived from said input clock signal in correspondence with said mode signal, said first clock signal and said second clock signal being in the same phase when said mode signal is at a first logical level, and said first clock signal and said second clock signal being in a phase complementary to each other when said mode signal is at a second logical level complementary to said first logical level; and a shift register, having a plurality of stages, receiving an input signal and controlled by said first clock signal and said second clock signal to selectively output a plurality of memory selection signals from said plurality of stages to said memory cell array, said input signal being shifted through said shift register by a first shift width when said first clock signal and said second clock signal are in the same phase, and by a second shift width different from said first shift width when said first clock signal and said second clock signal are in a phase complementary to each other.

2. A semiconductor memory circuit claimed in claim 1 wherein said shift register includes a plurality of register stages which are cascaded through a transfer stage connected between each pair of adjacent register stages and which are controlled by said first clock signal, each odd-numbered transfer stage being controlled by said second clock signal and each even-numbered transfer stage being controlled by said first clock signal so that when said mode signal is at said first logical level, information inputted at a first register stage is transferred through said shift register, one register stage by one register stage, and when said mode signal is at said second logical level, the information inputted at the first register stage is transferred through said shift register, two register stages by two register stages.

* * * * *

UNITED STATES PATENT AND TRADEMARK OFFICE
CERTIFICATE OF CORRECTION

PATENT NO. : 5,381,378
DATED : January 10, 1995
INVENTOR(S) : YASUNORI OKIMURA

It is certified that error appears in the above-identified patent and that said Letters Patent is hereby corrected as shown below:

Column 3, lines 29 to 30, delete "MODIE" and insert --MODE--.

Column 4, line 9, delete "chapel" and insert --channel--.

Column 5, line 24, delete "tile" and insert --the--.

Column 5, line 34, delete "tile" and insert --the--.

Signed and Sealed this

Thirtieth Day of May, 1995

Attest:

BRUCE LEHMAN

Attesting Officer     Commissioner of Patents and Trademarks